United States Patent [19]

Kirihara et al.

[11] Patent Number: 5,339,247
[45] Date of Patent: Aug. 16, 1994

[54] DISTRIBUTED DATA CAD SYSTEM

[75] Inventors: Shigeki Kirihara, Kawasaki; Shigeru Arai, Yokohama; Koichi Mitsuda, Kamakura, all of Japan

[73] Assignee: Hitachi, Ltd., Tokyo, Japan

[21] Appl. No.: 868,316

[22] Filed: Apr. 14, 1992

[30] Foreign Application Priority Data

Apr. 19, 1991 [JP] Japan .................................. 3-088113

[51] Int. Cl.$^5$ ............................................. G06F 15/46
[52] U.S. Cl. ................................ 364/468; 364/474.24
[58] Field of Search ............... 364/468, 222.81, 230,
364/245.5, 246.6, 282.1, 282.2, 283.1, 962,
962.1, 974, 474.24; 395/600, 425, DIG. 1, DIG.
2, 162, 166, 163, 800

[56] References Cited

U.S. PATENT DOCUMENTS

| | | | |
|---|---|---|---|
| 4,862,376 | 8/1989 | Ferriter et al. | 364/468 |
| 5,023,800 | 6/1991 | Carver et al. | 364/474.24 |
| 5,113,519 | 5/1992 | Johnson et al. | 395/600 |
| 5,128,878 | 7/1992 | Gore et al. | 395/162 |
| 5,218,695 | 6/1993 | Noveck et al. | 395/600 |

FOREIGN PATENT DOCUMENTS 62-128365  6/1987  Japan .
02-171860  7/1990  Japan .

*Primary Examiner*—Jerry Smith
*Assistant Examiner*—Jim Trammell
*Attorney, Agent, or Firm*—Fay, Sharpe, Beall, Fagan, Minnich & McKee

[57] ABSTRACT

In a computer aided design (CAD) system, by distributing managements of a number of concerned parts data to a plurality of work stations (WS), a large scale assembly constructed by a number of parts can be easily designed. There is provided a distributed data CAD system in which a user can easily progress the design of an assembly under distributed circumstances without being aware of the locations of the distributed information. A certain client WS transmits parts numbers to a server WS. The server WS searches a parts construction file by using the parts numbers as keys, thereby obtaining parts construction information and transmitting to the client WS. The client WS checks the parts construction information and when parts shape information exists in a parts shape file connected to its own WS, the client WS searches the file by using the shape names and physical path names as keys, thereby obtaining parts shape information. When the parts shape information exists in a file of another WS, the client WS transmits the shape names and physical path names to such a WS. The WS which has received them searches the parts shape file by using the shape names and physical path names as keys, thereby obtaining the parts shape information and transmitting to the client WS.

16 Claims, 8 Drawing Sheets

FIG. 7
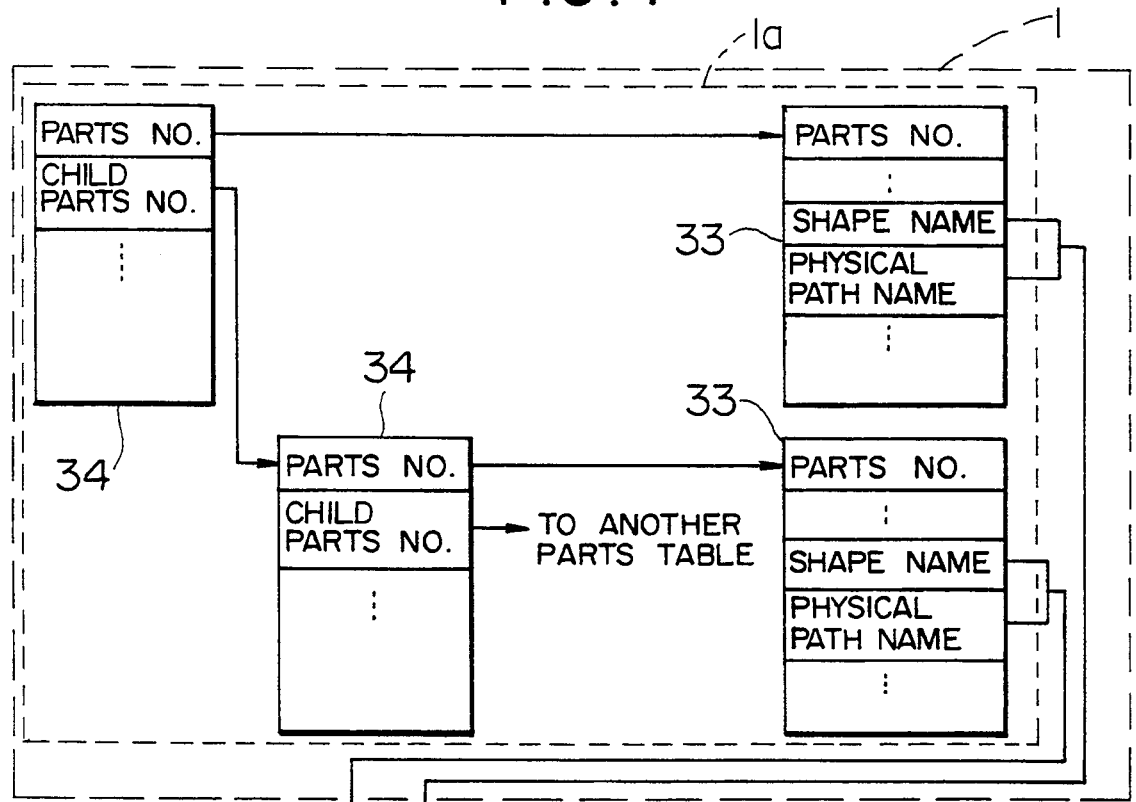
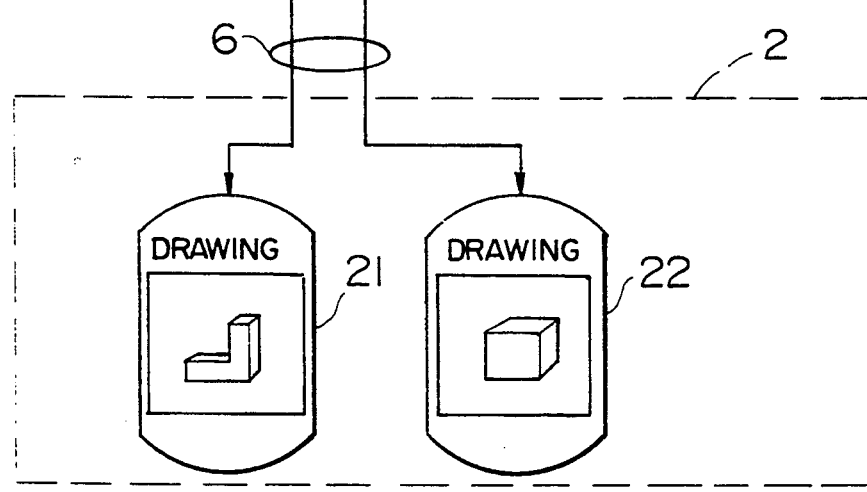
FIG. 8
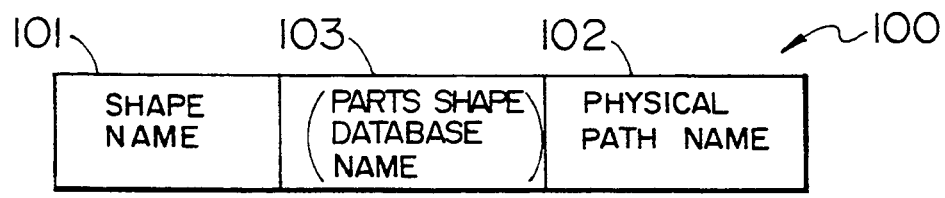

DISTRIBUTED DATA CAD SYSTEM

BACKGROUND OF THE INVENTION

The invention relates to a computer aided design (CAD) system and, more particularly, to a distributed data CAD system suitable for design of an assembled part whose data is distributed.

In the conventional CAD system, a plurality of terminals are connected to a single host computer by a network and data of the parts (an assembly constructed by a plurality of parts is also called a part here) is concentratedly managed by the single host computer.

To handle a number of parts having a complicated construction, parts data is divided into construction information (indicative of the parent/child relation among the parts) and the shape information (indicative of a drawing of the parts) and stored into a parts construction file and a parts shape file, respectively. A construction of assembly is shown by, for instance, a tree structure by using the construction information.

According to a processing procedure of the conventional CAD system, the parts number of the part to be referred is supplied from a certain terminal and transmitted to the host computer. The host computer searches the parts construction file by using the received parts number as a key, thereby obtaining the construction information of such a part. The construction information has the parts number, the shape name, and the parts number of the child part. When there is a child part among the searched parts, the child part is regarded as a part and the parts construction file is searched by using the parts number of such a child part as a key, thereby obtaining the construction information of the child part. The above processes are repeated until the child part doesn't exist. When the construction information of all of the parts constructing the part are obtained, the construction information is transmitted to the terminal. The terminal which has received the construction information searches the shape names of all of the part constructing an assembled part and transmits the shape names to the host computer. The single parts shape file has the shape name and the shape information. The host computer which has received the shape names searches the single parts shape file by using the shape names as a key and transmits the shape information of all of the parts to the terminal. The terminal which has received the shape information forms display data and displays it on a display.

There is also a system such that work stations (hereinafter, referred to as WSs) to concentratedly manage parts data are connected by a network and a file which is possessed by another WS can be commonly used.

In this case, all of the construction information of the parts which should be designed by the user and the parts shapes corresponding to those parts have been stored in the file connected to its own WS. Each user generally executes processes by using only the user's own WS.

In the case where there is a restricted relation between the parts to be designed by the user himself and the parts to be designed by another user and the user must refer to the parts in charge of another user upon designing of the parts in charge of the user, since the data of such parts doesn't exist in the file of the user's own WS, the user communicates with the WS having the file in which the data of such parts has been stored and declares a common use and switches the file, thereby using the target data as if such data existed in the file connected to the user's own WS. In the above case, however, the user must preliminarily know the location of the file of another user whose common use should be declared.

As literatures regarding such a kind of technique, for instance, there are JP-A-62-128365 and JP-A-2-171860.

In the above conventional technique, no consideration is paid to a point that a number of related parts data are distributively managed. The host computer or each terminal concentratedly manages those parts data, so that there are problems such as deterioration of a response speed, limitation of the machine performance, limitation of resources, and the like.

SUMMARY OF THE INVENTION

It is an object of the present invention to provide a distributed data CAD system which can effectively manage parts data while distributing the parts data of a number of related parts.

To accomplish the above object, preferably, there is provided a CAD system in which a plurality of computers having a plurality of memory means for distributively storing at least one of construction information indicative of the parent/child (hierarchy) relation among parts of an assembly constructed by a plurality of parts and shape information indicative of drawings of the parts are connected by a network, the storing destinations of the shape information of a plurality of parts which have been concerned by the construction information and identifiers to uniquely identify the parts are made correspond to each other, the storing destination of the shape information of each part corresponding to the identifier of each part is derived, and the shape information of the related part can be obtained from the storing destination of the shape information derived.

Since the identifier of the part and the storing destination of the shape information of such a part are made correspond to each other, even when the shape information is distributed, the shape information can be obtained from the identifier of the part without being aware of the location thereof.

The construction information of the concerned parts can be also distributively stored into a plurality of memory means. In such a case, the identifiers of the parts and the storing destinations of the construction information of those parts are also made correspond to each other. In a manner similar to the case where the shape information is distributed, the construction information can be also obtained from the identifiers of the parts without being aware of the locations of the parts. Consequently, the shape information can be derived.

Since the identifiers of the parts which are concerned with the relevant part can be known from the construction information, both of the shape information and the construction information of all of the parts constructing the relevant part can be obtained without being aware of the locations of those parts.

BRIEF DESCRIPTION OF THE DRAWINGS

FIG. 7 is a diagram showing the relation between the construction of the parts construction information and the distributed parts shape information according to still another modification of the invention;

FIG. 8 is a diagram showing a construction of a parts shape information management table;

DESCRIPTION OF THE PREFERRED EMBODIMENTS

Figure 1:
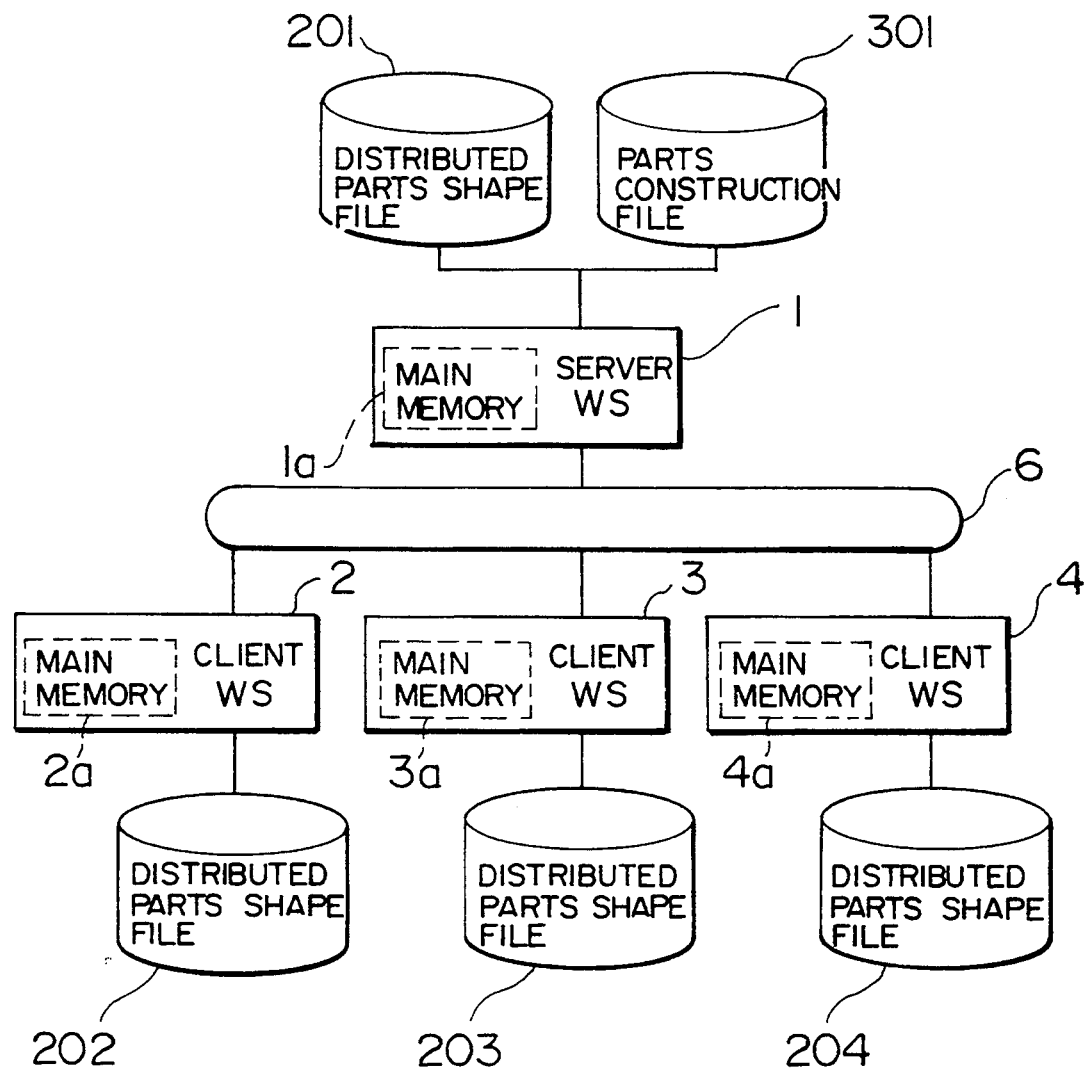
FIG. 1 is a constructional diagram of a distributed data CAD system according to an embodiment of the invention.

FIG. 1 is a constructional diagram of a distributed data CAD system according to an embodiment of the invention.

The embodiment relates to the case where parts shape files in which parts shape information is stored are distributed and a parts construction file in which parts construction information is concentratedly managed by a predetermined server WS 1.

The distributed data CAD system is constructed by WS 1 to WS 4 connected by a local area network (hereinafter, referred to as an LAN) 6. The server WS 1 has a single parts construction file 301 and a parts shape file 201. The client WS 2 to WS 4 have parts shape files 202 to 204, respectively. The WS 1 and WS 4 have main memories 1a to 4a, respectively.

The parts shape information of the parts constructing the assembly A are distributively stored in the parts shape files 202 to 204. The parts shape information has the shape name and the parts shape data.

It is now assumed as follows. The parts shape information of A is stored in the parts shape file 201. The parts shape information of B, E, F, and G is stored in the parts shape file 202. The parts shape information of C, H, and I is stored in the parts shape file 203. The parts shape information of D, J, K, L, and M is stored in the parts shape file 204.

All of the parts construction information of the assembly A which is handled by the CAD system is stored in the parts construction file 301.

Figure 2:
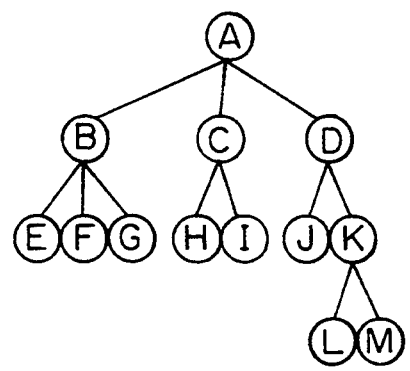
FIG. 2 is a constructional diagram of an assembly A.

It is now assumed that the construction of the assembly (part) A has a tree structure as shown in FIG. 2. That is, the assembly A has child parts B, C, and D. The parts (partial assemblies each of which comprises a plurality of parts) B, C, and D have child parts (E, F, and G), (I and J), and K, respectively. The part (partial assembly) K has child parts L and M. The assembly as a set of parts is also regarded as a part.

Figure 3:
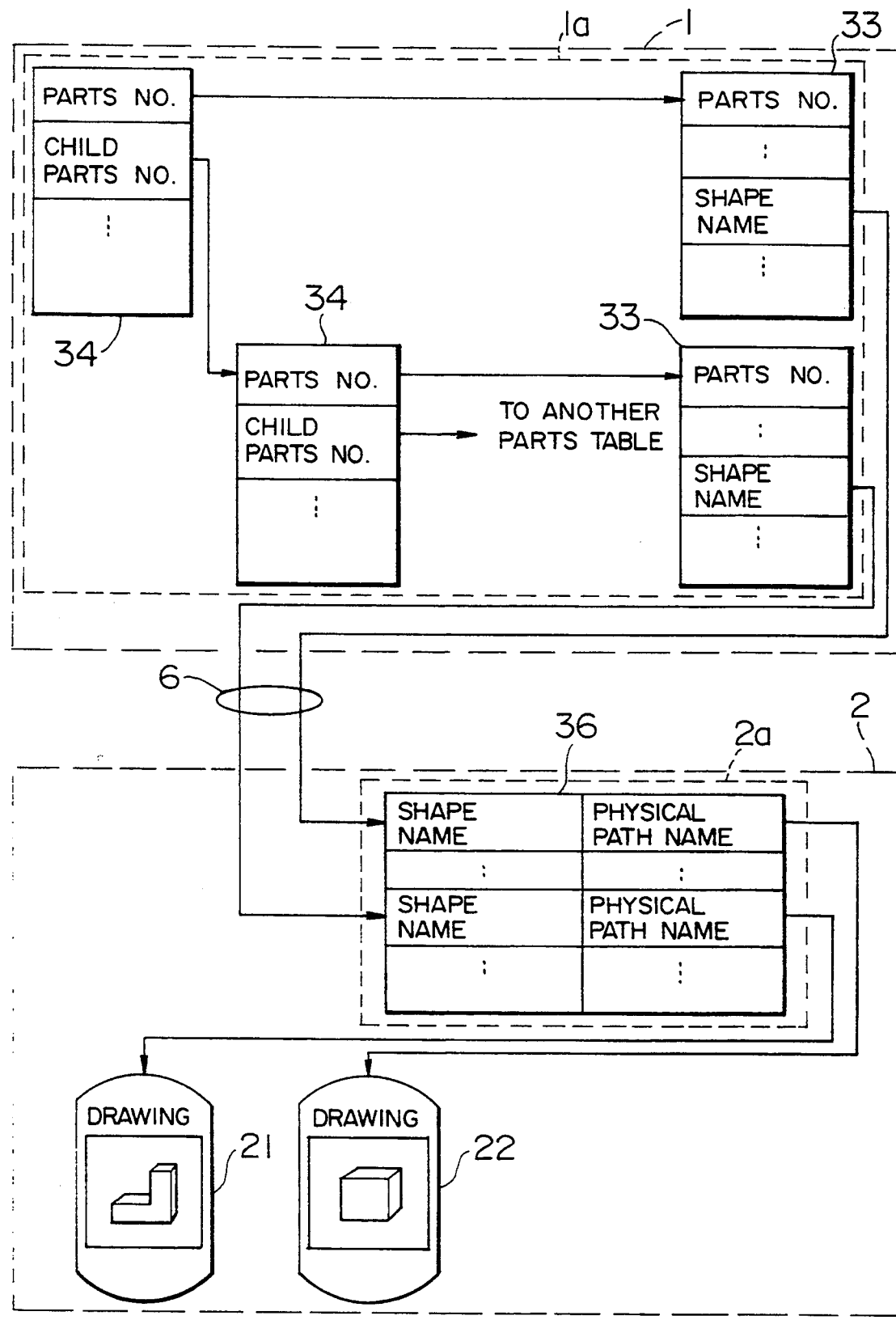
FIG. 3 is a diagram showing the relation between the parts construction information on a parts construction file and the distributed parts shape information.
Figure 4:
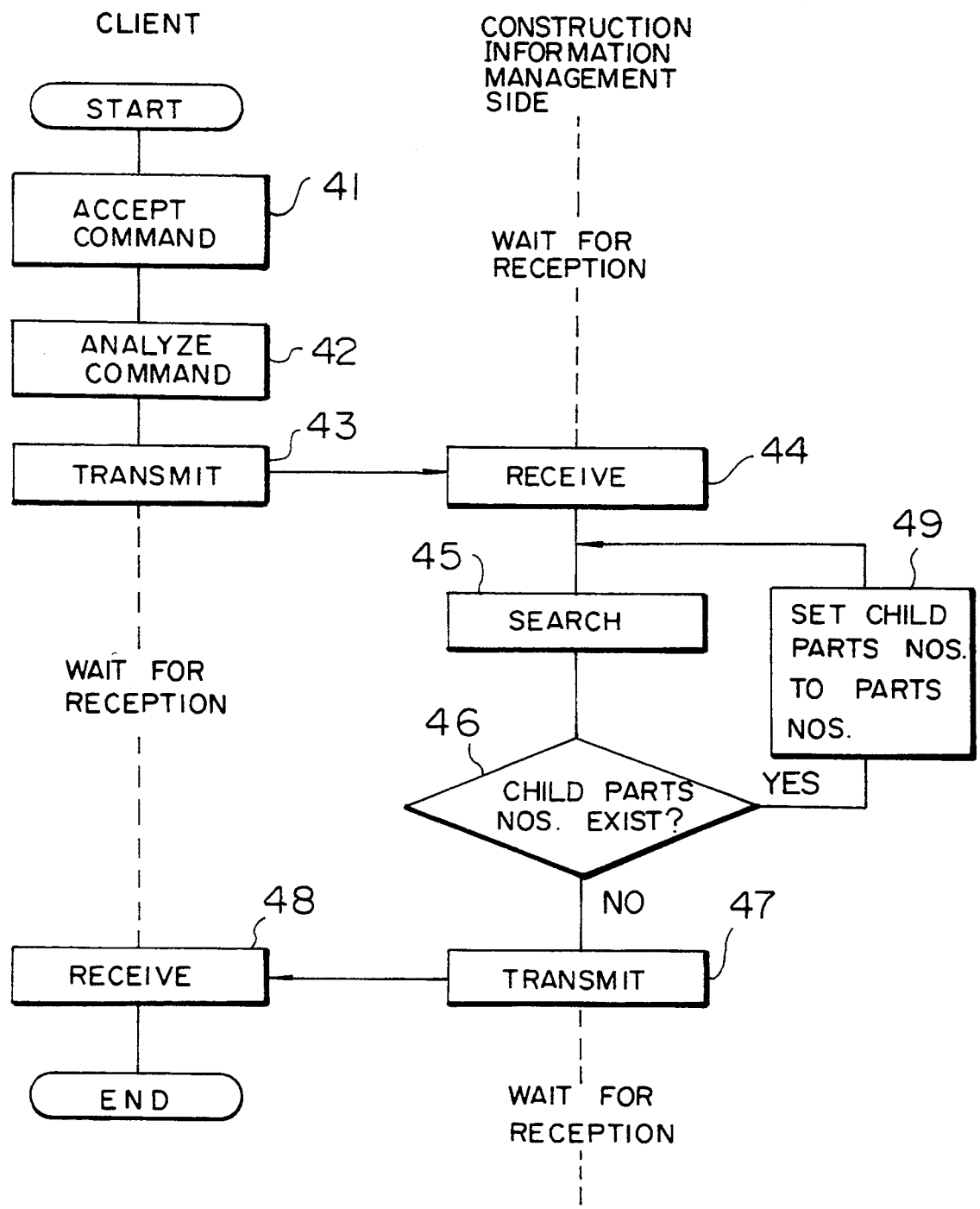
FIG. 4 is a flowchart showing a flow for processes which are executed until parts construction information is obtained from the parts numbers according to the distributed data CAD system.
Figure 5:
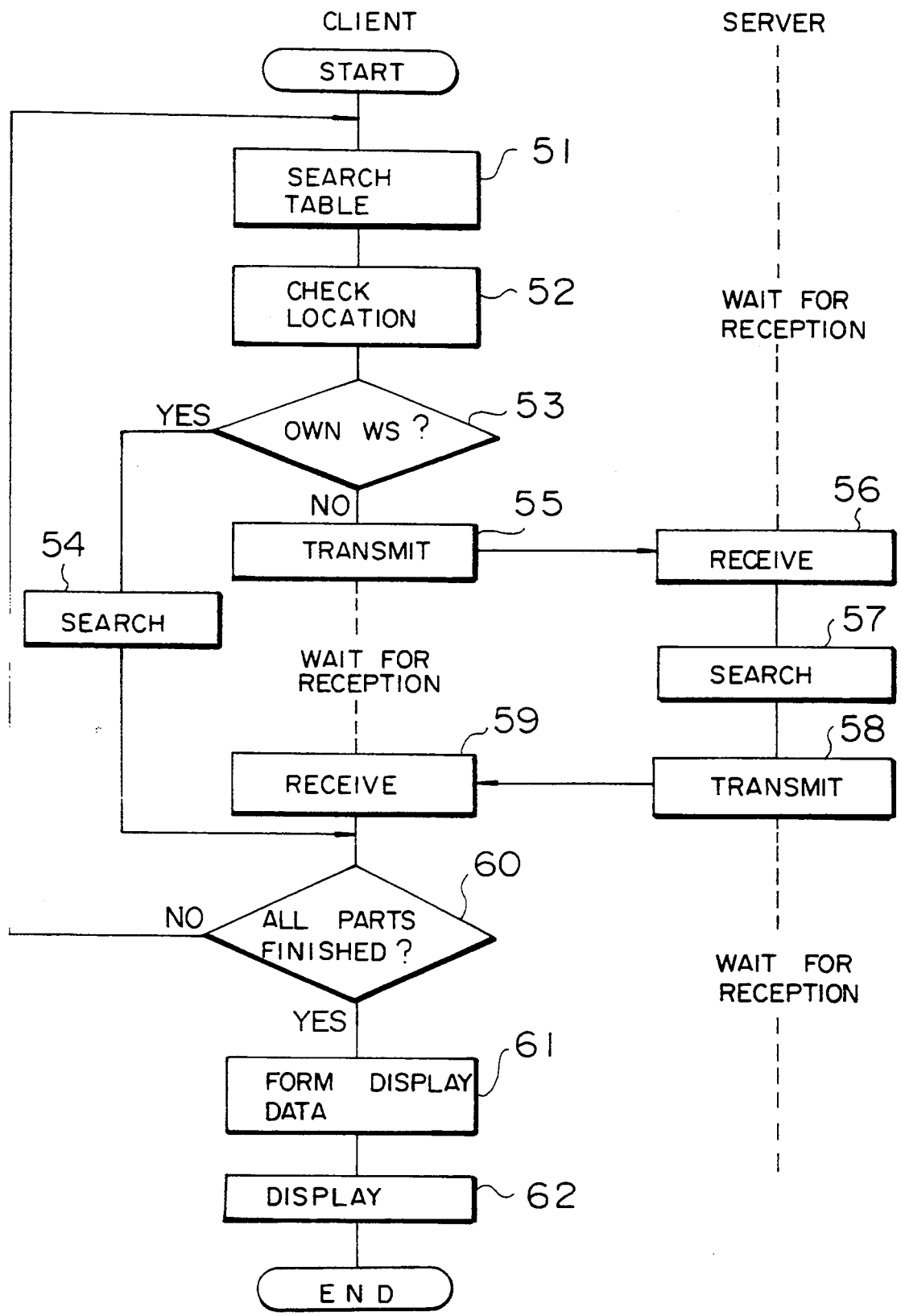
FIG. 5 is a flowchart showing a flow for processes which are executed until parts shape information is obtained from parts construction information according to the distributed data CAD system.

FIG. 3 shows the relation between the construction of the parts construction information and the parts shape information in the embodiment of the invention shown in FIG. 1. The parts construction file 301 has a relational type database format and has a table constructing parts information. The WS 1 forms parts information tables 33 and 34 into its own main memory is on the basis of the parts construction information stored in the parts construction file 301. The parts intrinsic information table 33 and the construction information table 34 are stored in the parts construction file 301. The parts intrinsic information table 33 and the construction information table 34 are the information which is provided for each part. The part number, part name, shape name, part kind, date of formation, etc. are stored in the parts intrinsic information table 33. The part number and the numbers of all of the child parts of such a part are stored in the construction information table 34 and the table 34 shows the parent/child relation among the parts. In response to a request from the client WS, the server WS 1 reeds out both of the tables 33 and 34 from the file 301 and stores into its own main memory 1a. The information of the tables 33 and 34 is automatically formed when the user who has designed the part registers the shape data.

A parts shape management table 36 has shape names and physical path names (physical file names in which parts shape information is stored and the address of the WS) and is stored into the distributed parts shape file of each client WS. When each client WS requests, the table 36 is read out from its own file and stored into its own main memory. In the embodiment, it is necessary that the system manager previously determines the shape names and storing locations and informs them to the person in charge of each WS and forms the parts shape management table 36 before the system is started.

The invention is not limited to the above method but it is also possible to use a method whereby a WS to manage the data is installed on the network and the system manager forms the parts shape management table 36 onto the WS.

According to the above construction, by supplying the parts numbers from the client WS, drawings 21 and 22 indicative of the shapes of parts existing in the distributed parts shape file can be obtained.

A processing procedure in the case where the user of the client WS 2 searches the parts shape information of the part C, the parts number of the part C is supplied as a parts search command to the client WS 2 (step 41). The client WS 2 checks characters to see if the input parts number is expressed by a correct character train or not (step 42). The input parts number is transmitted to the server WS 1 which manages the parts construction file 301 (step 43). The WS 1 receives the parts number (step 44) and searches the parts construction file 301 by using the parts number as a key, thereby obtaining the parts intrinsic information table 33 and the construction information table 34 of the part C into its own main memory 1a. All of the shape names written in the parts intrinsic information table 33 are searched (step 45). A check is made to see if there are the child parts numbers in the construction information table 34 or not (step 46). In the case of the part C, since there are the child parts H and I, the child parts numbers are set to parts numbers (step 49) and a searching process similar to that in the case of C is executed with respect to the parts H and I (step 45). Since there is no child parts number with regard to the parts H and I (step 46), the shape names are obtained from the parts intrinsic information table 33 and the construction information table 34 of all of the parts constructing the part C. Therefore, those shape names are transmitted as parts construction information to the client WS 2 (step 47). The client WS 2 receives the parts construction information of each of the parts C, H, and I (step 48).

The client WS 2 which has received the parts construction information searches the parts shape management table 36 in the main memory 2a of its own WS by using the shape name in the parts construction information of the part C as a key (step 51). The location of the parts shape information is checked from the physical path name derived as a result of the search (step 52). A check is now made to see if the parts shape information exists in its own client WS 2 or not (step 53). If it exists in the parts shape file 202 of its own client WS 2, the file 202 is searched by using the physical path name and shape name as keys, thereby obtaining the parts shape information (step 54). However, since the parts shape information of the part C exists in the file 203 of the client WS 3, the client WS 2 transmits the physical path name and shape name of the part C to the client WS 3 (step 55).

The client WS 3 receives the physical path name and shape name (step 56). The client WS 3 searches the file by using the physical path name and shape name as keys, thereby obtaining the part shape information of the part B (step 57) and transmits to the client WS 2 (step 58). The client WS 2 receives the parts shape information of the part B (step 59).

Processes similar to those for the part C are also sequentially executed with respect to the parts H and I.

The client WS 2 judges whether all of the parts shape information of the parts C, H, and I have been obtained or not (step 60). If YES, the parts data is assembled and the display data is formed (step 61) and displayed on a graphic display (step 62).

Similar processes are also executed with respect to commands (registration etc.) other than the parts search command.

Figure 6:
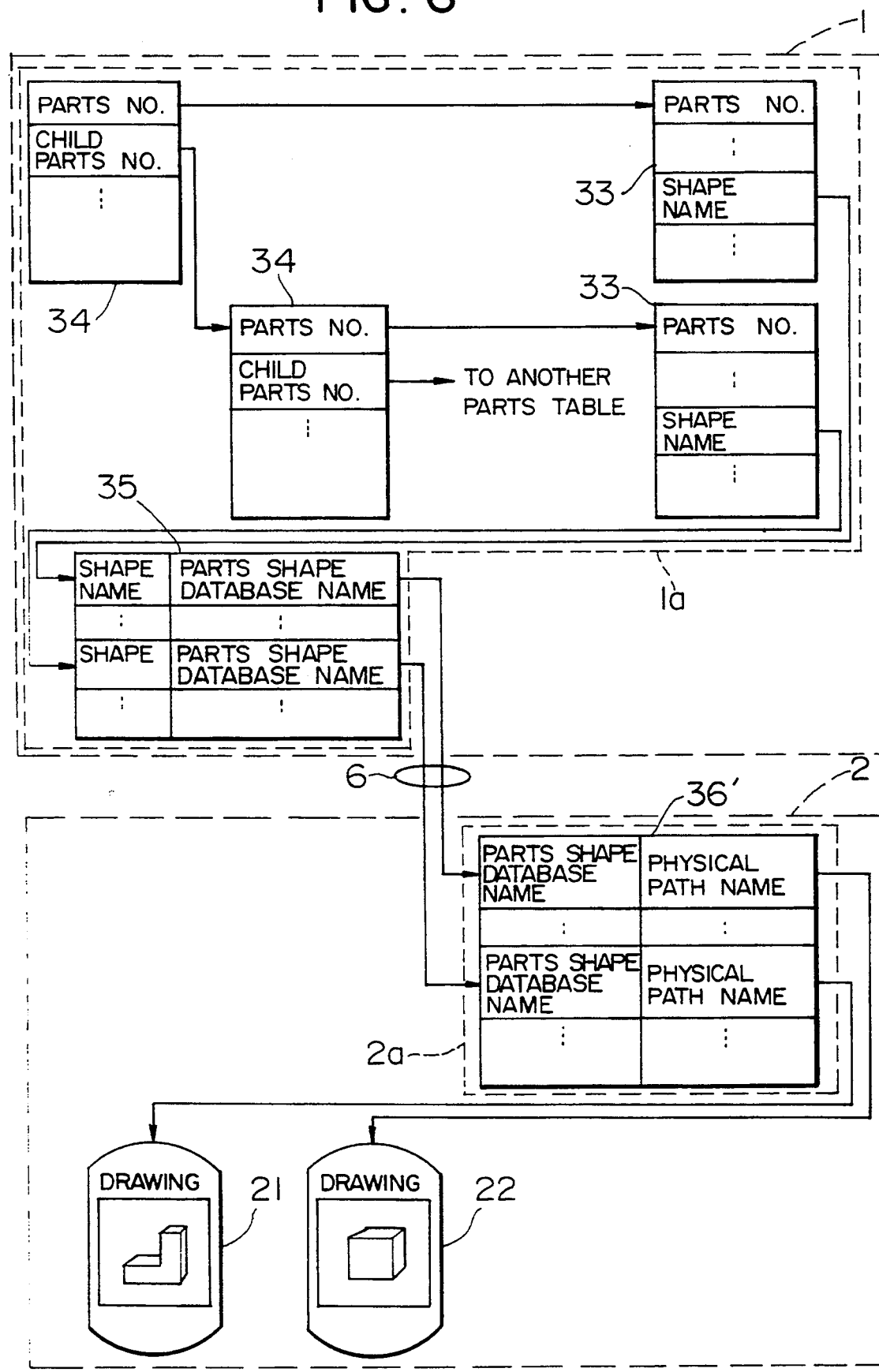
FIG. 6 is a diagram showing the relation between the construction of the parts construction information and the distributed parts shape information according to another modification of the invention.

In FIG. 3, the server WS 1 transmits the shape names of all of the concerning parts to the client WS 2 as desired construction information. FIG. 6 shows a modification of FIG. 3. The parts construction file 301 further has a shape intrinsic information table 35 in which the shape name and the parts shape database name (logical file name of a file in which the parts shape information is stored) are made correspond to each other. The shape intrinsic information table 35 is read out onto the main memory is by the server WS 1. The server WS 1 transmits the parts shape database names corresponding to the shape names of all of the concerned parts as desired construction information to the client WS 2. The client WS 2 which has received the parts shape database names can obtain the location of the file in which a desired part shape is stored by referring to a parts shape database management table 36' in which the parts shape database name and the physical path name are made correspond to each other and which has previously been formed. By using the parts shape database names as keys, the user himself can easily understand the location of the file.

In the embodiment, the parts shape management table 36 and the parts shape database management table 36' are handled as independent information separately from the parts construction information. However, it is not always necessary to provide such management tables.

As a part of the parts construction information, namely, the parts construction information can have the parts number, child parts number, parts name, shape name, parts kind, date of formation, parts shape database name, physical path name, and the like and can also be stored in the construction file.

FIG. 7 shows still another modification of FIG. 3. In addition to the shape names, the physical path names corresponding to the shape names are stored in the parts intrinsic information table 33. Consequently, the server WS 1 can obtain the shape name and the logical path name corresponding thereto by searching the parts intrinsic information table 33. Therefore, by using those names, the server WS 1 reads out the shape data from the file designated by the logical path name and transmits to the client WS 2.

The shape name and the logical path name corresponding thereto which have been obtained by the server WS 1 can also be transmitted as parts construction information to the client WS 2. In such a case, the client WS 2 can obtain desired shape information at an arbitrary timing on the basis of the parts construction information received from the server WS 1.

In the present invention, in the case where the parts shape data is stored into a plurality of distributed files, at least a combination of a shape name field 101 and a physical path name field 102 as shown in FIG. 8 are necessary in each row 100 of the parts shape management table. It is also possible to provide a parts shape database name field 103 for easy understanding of the user if necessary.

In the above embodiment, the client WS 2 divisionally transmits the physical path names and shape names of the parts C, H, and I to the client WS 3 three times. However, the physical path names and shape names of the parts C, H, and I can be also transmitted in a block at a time. That is, the data to be transmitted can be also combined for every WS.

Figure 9:
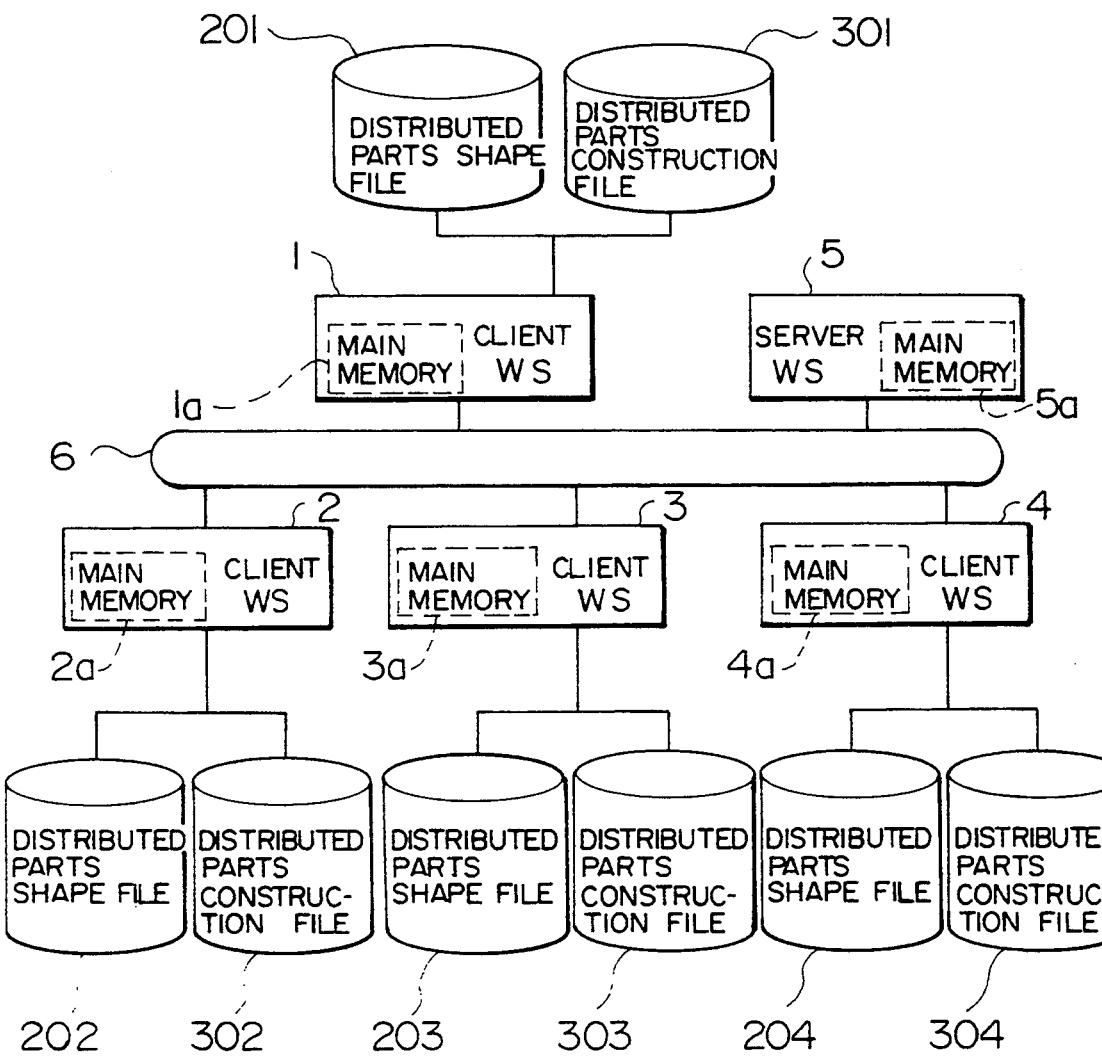
FIG. 9 is a constructional diagram of a distributed data CAD system according to another embodiment of the invention.

FIG. 9 is a constructional diagram of a distributed data CAD system of another embodiment of the invention.

The embodiment relates to the case where both of the parts shape file (parts shape information) and the parts construction file (parts construction information) are distributed.

The distributed data CAD system of the embodiment comprises WS 1 to WS 5 connected by the LAN 6. The WS 1 to WS 4 have the distributed parts construction files 301 to 304 and the distributed parts shape files 201 to 204, respectively. The server WS 5 has a parts construction information management table to manage the parts construction information in a memory. In the embodiment, it should be noted that the server WS is WS 5 instead of WS 1. The WS 1 is one of the client WSs.

A construction of the assembly A is similar to that in the foregoing embodiment shown in FIG. 2 and is presumed as follows.

The parts construction information of the parts constructing the assembly A is distributively stored into the parts construction files 301 to 304.

No parts construction information is stored in the parts construction file 301. The parts construction information of A, B, E, F, and G is stored in the parts construction file 302. The parts construction information of C, H, I, L, and M is stored in the parts construction file 303. The parts construction information of D, J, and K is stored in the parts construction file 304.

The parts shape information of the parts constructing the assembly A is distributively stored in the parts shape files 201 to 204.

The parts shape information of A is stored in the parts shape file 201. The parts shape information of B, E, F, and G is stored in the parts shape file 202. The parts shape information of D, J, K, C, H, and I is stored in the parts shape file 203. The parts shape information of L and M is stored in the parts shape file 204.

Figure 10:
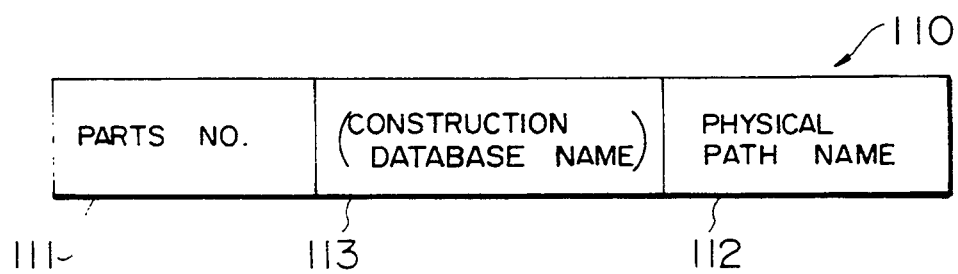
FIG. 10 is a diagram showing a construction of a parts construction information management table.

FIG. 7 is referred on the basis of the above assumption. FIG. 10 shows a construction of a parts construction information management table 110 to manage the parts construction information in an associated main memory 5a of the server WS 5. The parts construction information management table 110 has a parts number field 111, a construction database name field 113 (logical file names having the parts construction information), and a physical path name field 112 (a physical file name having the parts construction information and an address of WS). The construction database name field 113 is not indispensable but can be also omitted as necessary.

Figure 11:
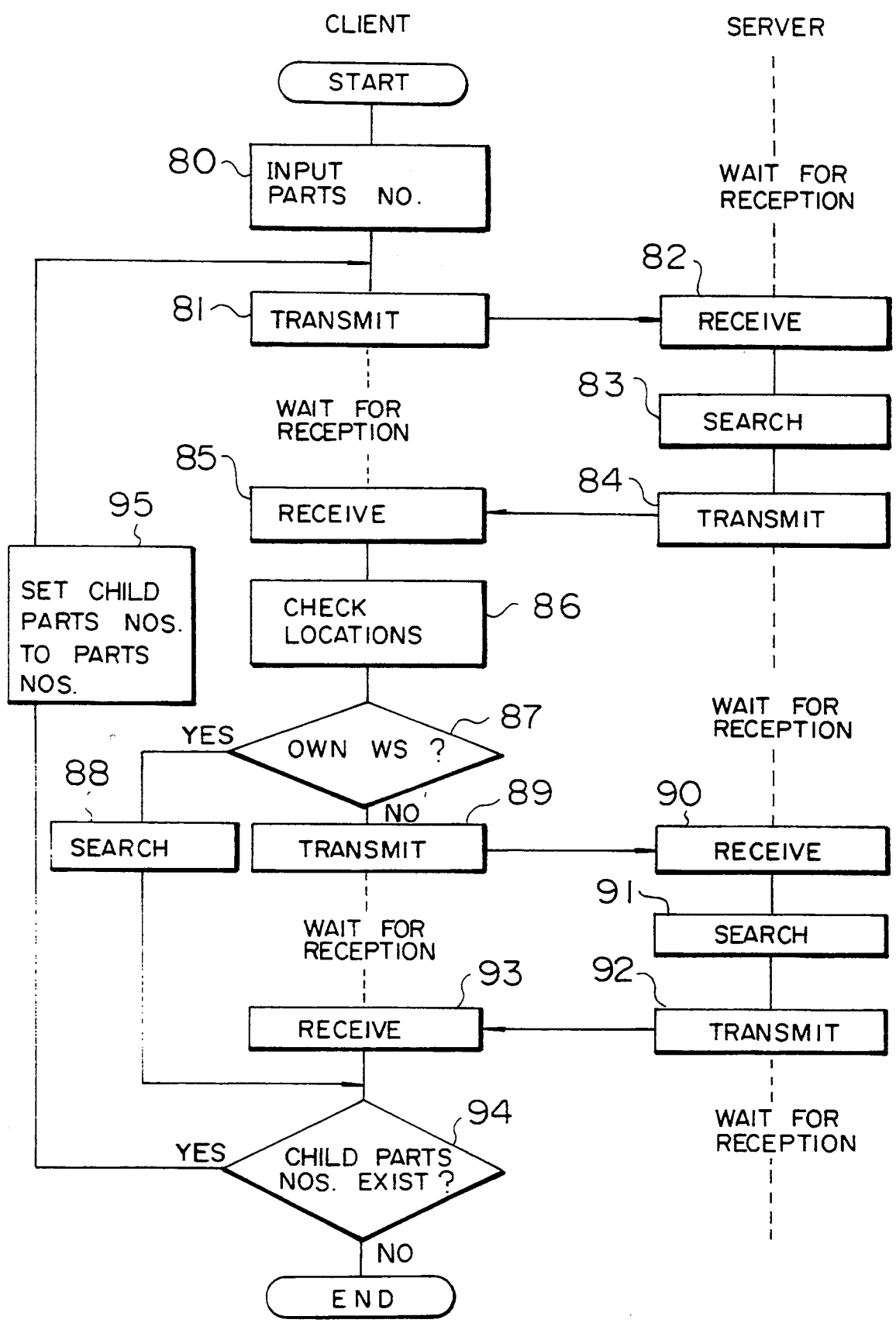
FIG. 11 is a flowchart showing a flow for processes which are executed until parts construction information is obtained from parts numbers according to another embodiment of the invention.

FIG. 11 shows a procedure for processes which are executed until the parts construction information is obtained.

When the user searches the parts shape information of the part D from the client WS 3, the user supplies the number of the part D as a parts search command to the client WS 3 (step 80). The client WS 3 transmits the number of the part D to the server WS 5 having the parts construction information management table 110 (step 81). The server WS 5 receives the parts number (step 82) and searches the table 110 by using the parts number as a key, thereby obtaining the stored construction database name and physical path name of the part D (step 83). The stored construction database name and physical path name of the part D are transmitted to the client WS 3 (step 84).

The client WS 3 receives the construction database name and physical path name (step 85) and checks the location of the parts construction information of the part D on the basis of the construction database name and physical path name (step 86). A check is now made to see if the parts construction information exists in its own WS 3 or not (step 87). If YES, the table is searched by using the parts number and physical path name as keys, thereby obtaining the construction information (step 88). In the example, since the parts construction information exists in the client WS 4, the parts number and physical path name are transmitted to the client WS 4 (step 89). The client WS 4 receives the parts number and physical path name (step 90) and searches the table by using the parts number and physical path name as keys, thereby obtaining the parts construction information of the part D (step 91) and transmitting to the client WS 3 (step 92).

The client WS 3 receives the parts construction information of the part D (step 93) and searches the child parts number which the parts construction information of the part D possesses, thereby checking the existence of the child parts (step 94). In the embodiment, since parts numbers of the parts J and K exist as child parts numbers, those child parts numbers are set into the parts numbers (step 95). Processes similar to those for the part D are also executed for the parts J and K, thereby obtaining the parts construction information of the parts J and K.

Since the part K has the child parts although the part J has no child part, the client WS 3 also performs similar processes with respect to the child parts L and M of the part K, thereby obtaining the parts construction information of the parts L and M. Since the parts construction information of the parts L and M exist in its own terminal, they are searched without transmitting them. Such a point differs from the cases of the parts D, J, and K.

The processes are repeated until no child part exists, thereby obtaining the parts construction information of all of the parts (parts D, J, K, L, and M) constructing the part D.

The processes after the construction information was obtained are similar to those in the foregoing embodiment. The client WS 3 obtains the parts shape information from its own terminal with respect to the parts D, J, and K and obtains the parts shape information from the client WS 4 with regard to the parts L and M and forms display data and displays on the display.

It is also possible to construct in a manner such that the numbers of the child parts are prepared in the parts construction information management table and the server WS 5 obtains the construction database names and physical path names of all of the parts constructing the relevant part from the numbers of the child parts derived as a result of the search and transmits them to the client WS 3 in a block. Since there is a one-to-one corresponding relation between the construction database name and the physical path name, it is not always necessary to use the construction database name.

According to the invention, since the concerned data can be distributively managed, there are effects such that an assembly of a large scale can be easily designed and the user can easily progress the design of the assembly under distributed circumstances without being aware of the locations of the distributed information.

We claim:

1. A computer aided design (CAD) system using distributed data, comprising:

a server work station (WS) and a plurality of client WSs which are mutually connected;

a parts construction file which is connected to said server WS and in which construction information indicative of a hierarchy relation among a plurality of parts constructing an assembly, identifiers corresponding to said parts, and parts shape names corresponding to said parts is stored;

a plurality of parts shape files which are respectively connected to said plurality of client WSs and distributively store shape data of said plurality of parts constructing said assembly; and a parts shape management table which is provided for each of said client WSs and indicates corresponding relation between said plurality of parts shape names and their storing destinations in said parts shape files, wherein in response to the identifier which has been transmitted from arbitrary one of said plurality of client WSs and which designates the assembly whose shape should be displayed on a display device, said server WS searches the parts construction file and obtains the parts shape names corresponding to a plurality of parts constructing the designated assembly corresponding to said identifier and transmits said parts shape names to the client WS, so that the client WS refers to said parts shape management table and collects the shape data of the parts constructing the assembly from said plurality of parts shape files, and the assembly is displayed on the display device associated to the client WS.

2. A CAD system according to claim 1, wherein said server WS also has said parts shape file.

3. A CAD system according to claim 1, wherein said server WS and said plurality of client WS are mutually connected through a network.

4. A computer aided design (CAD) system using distributed data, comprising:

a server work station (WS) and a plurality of client WSs which are mutually connected;

a parts construction file which is connected to said server WS and in which construction information indicative of a hierarchy relation among a plurality of parts constructing an assembly, identifiers corresponding to said parts, and parts shape names corresponding to said parts is stored;

a plurality of parts shape files which are respectively connected to said plurality of client WSs and distributively store shape data of said plurality of parts constructing said assembly;

a first parts shape management table which is provided for said server WS and indicates corresponding relations between said plurality of parts shape names and logical file names in said parts shape file; and a second parts shape management table which is provided for each of said client WS and indicates corresponding relations between said plurality of logical file names and physical path names into said parts shape file, wherein in response to the identifier which has been transmitted from arbitrary one of said plurality of client WSs and which designates the assembly whose shape should be displayed on a display device, said server WS searches the parts construction file and obtains the parts shape names corresponding to a plurality of parts constructing the designated assembly corresponding to said identifier and obtains the logical file names corresponding to said parts shape names with reference to said first parts shape management table and transmits said logical file names to the client WS, so that the client WS refers to the second parts shape management table and collects the shape data of the parts constructing the assembly from said plurality of parts shape files, and the assembly is displayed on the display device associated to the client 5. A CAD system according to claim 4, wherein said server WS and said plurality of client WSs are mutually connected through a network.

6. A computer sided design (CAD) system using distributed data, comprising:

a server work station (WS) and a plurality of client WSs which are mutually connected;

a parts construction file which is connected to said server WS and in which construction information indicative of a hierarchy relation among a plurality of parts constructing an assembly, identifiers corresponding to said parts, parts shape names corresponding to said parts, and storing destinations in the parts shape file corresponding to said parts is stored; and a plurality of parts shape files which are respectively connected to said plurality of client WSs and distributively store shape data of said plurality of parts constructing said assembly, wherein in response to the identifier which has been transmitted from arbitrary one of said plurality of client WSs and which designates the assembly whose shape should be displayed on a display device, said server WS searches the parts construction file and obtains the parts shape names corresponding to a plurality of parts constructing the designated assembly corresponding to said identifier and said storing destinations and collects the shape data of the parts constructing the assembly from said plurality of parts shape files and transmits said shape data to the client WS, and said client WS displays the assembly onto the display device associated to said client WS.

7. A CAD system according to claim 6, wherein said server WS and said plurality of client WSs are mutually connected through a network.

8. A computer aided design (CAD) system using distributed data, comprising:

a server work station (WS) and a plurality of client WSs which are mutually connected;

a plurality of parts construction files which are respectively connected to said plurality of client WSs and in which construction information indicative of a hierarchy relation of a plurality of parts constructing an assembly, identifiers corresponding to said parts, and parts shape names corresponding to said parts is distributively stored;

a plurality of parts shape files which are respectively connected to said plurality of client WSs and distributively store shape data of said plurality of parts constructing said assembly;

a parts construction management table which is provided for said server WS and indicates corresponding relations between the identifiers of said plurality of parts and storing destinations in the parts construction file; and a parts shape management table which is provided for each of said client WSs and indicates corresponding relations between said plurality of parts shape names and their storing destinations in said parts shape files, wherein in response to the identifier which has been transmitted from arbitrary one of said plurality of client WSs and which designates the assembly whose shape should be displayed on a display device, said server WS searches said plurality of parts construction files with reference to said parts construction management table and obtains the parts shape names corresponding to said plurality of parts constructing said designated assembly corresponding to the identifier and transmits said parts shape names to the client WS, and the client WS refers to the parts shape management table and collects the shape data of the parts constructing the assembly from said plurality of parts shape file, and the assembly is displayed on the display device associated the client WS.

9. A CAD system according to claim 8, wherein said server WS and said plurality of client WSs are mutually connected through a network.

10. A computer aided design (CAD) system using distributed data, comprising:

a server work station (WS) and a plurality of client WSs which are mutually connected;

a plurality of parts construction files which are respectively connected to said client WSs and in which construction information indicative of a hierarchy relation among a plurality of parts constructing an assembly, identifiers corresponding to said parts, and parts shape names corresponding to said parts is distributively stored;

a plurality of parts shape files which are respectively connected to said plurality of client WSs and distributively store shape data of said plurality of parts constructing said assembly;

a parts construction management table which is provided for said server WS and indicates corresponding relation between the identifiers of said plurality of parts and their storing destinations in said plurality of parts construction file; and a parts shape management table which is provided for the server WS and indicates corresponding relations between said plurality of parts shape names and their storing destinations in the parts shape file, wherein in response to the identifier which has been transmitted from arbitrary one of said plurality of client WSs and which designates the assembly whose shape should be displayed on a display device, said server WS searches said plurality of parts construction files with reference to said parts construction management table and obtains the parts shape names corresponding to said plurality of parts constructing said designated assembly corresponding to the identifier and said storing destinations and refers to said parts shape management table and collects the shape data of the parts constructing the assembly from said plurality of parts shape files and transmits said shape data to the client WS, so that the client WS displays the assembly onto the display device associated to said client WS.

11. A CAD system according to claim 10, wherein said server WS and said plurality of client WSs are mutually connected through a network.

12. A distributed data managing method in a computer aided design (CAD) system comprising:

a server work station (WS) and a plurality of client WSs which are mutually connected;

a parts construction file which is connected to said server WS and in which construction information indicative of a hierarchy relation among a plurality of parts constructing an assembly, identifiers corresponding to said parts, and parts shape names corresponding to said parts is stored;

a plurality of parts shape files which are respectively connected to said plurality of client WSs and distributively store shape data of said plurality of parts constructing said assembly; and a parts shape management table which is provided for each of said client WSs and indicates corresponding relations between said plurality of parts shape names and their storing destinations in said parts shape files, wherein said method comprises the steps of:

in said server WS, searching said parts construction file in response to the identifier which has been transmitted from arbitrary one of said client WSs and which designates the assembly whose shape should be displayed on a display device;

in said server WS, obtaining the parts shape names corresponding to said plurality of parts constructing said designated assembly corresponding to the identifier and transmitting said parts shape names to said client WS;

in said client WS, collecting the shape data of the parts constructing said assembly from said plurality of parts shape files with reference to said parts shape management table; and in said server WS, displaying the assembly onto the display device associated to the client WS.

13. A distributed data managing method in a computer aided design (CAD) system comprising:

a server work station (WS) and a plurality of client WSs which are mutually connected;

a parts construction file which is connected to said server WS and in which construction information indicative of a hierarchy relation among a plurality of parts constructing an assembly, identifiers corresponding to said parts, and parts shape names corresponding to said parts is stored;

a plurality of parts shape files which are respectively connected to said plurality of client WSs and distributively store shape data of said plurality of parts constructing said assembly;

a first parts shape management table which is provided for said server WS and indicates corresponding relations between said plurality of parts shape names and logical file names in said parts shape file; and a second parts shape management table which is provided for each of said client WSs and indicates corresponding relations between said plurality of logical file names and physical path names into said parts shape file, wherein said method comprises the steps of:

in said server WS, searching said parts construction file in response to the identifier which has been transmitted from arbitrary one of said client WSs and which designates the assembly whose shape should be displayed on a display device, thereby obtaining the parts shape names corresponding to said plurality of parts constructing said designated assembly corresponding to the identifier;

in said server WS, referring to said first parts shape management table and obtaining the logical file names corresponding thereto;

in said server WS, transmitting said logical file names to said client WS;

in said client WS, collecting the shape data of the parts constructing the assembly from said plurality of parts shape files with reference to the second parts shape management table; and in said client WS, displaying the assembly onto the display device associated to said client WS.

14. A distributed data managing method in a computer aided design (CAD) system comprising:

a server work station (WS) and a plurality of client WSs which are mutually connected;

a parts construction file which is connected to said server WS and in which construction information indicative of a hierarchy relation among a plurality of parts constructing an assembly, identifiers corresponding to said parts, parts shape names corresponding to said parts, and storing destinations in the parts shape file corresponding to said parts is stored; and a plurality of parts shape files which are respectively connected to said plurality of client WSs and distributively store shape data of said plurality of parts constructing said assembly, wherein said method comprises the steps of:

in said server WS, searching said parts construction file in response to the identifier which has been transmitted from arbitrary one of said client WSs and which designates the assembly whose shape should be displayed on a display device, thereby obtained the parts shape names corresponding to said plurality of parts constructing said designated assembly corresponding to the identifier and said storing destinations;

in said server WS, collecting the shape data of the parts constructing the assembly from said plurality of parts shape files on the basis of said parts shape names and said storing destinations;

in said server WS, transmitting the resultant shape data to said client WS; and in said client WS, displaying the assembly onto the display device associated to said client WS.

15. A distributed data managing method in a computer sided design (CAD) system comprising:

a server work station (WS) and a plurality of client WSs which are mutually connected;

a plurality of parts construction files which are respectively connected to said plurality of client WSs and in which construction information indicative of a hierarchy relation of a plurality of parts constructing an assembly, identifiers corresponding to said parts, and parts shape names corresponding to said parts is distributively stored;

a plurality of parts shape files which are respectively connected to said plurality of client WSs and distributively store shape data of said plurality of parts constructing said assembly;

a parts construction management table which is provided for said server WS and indicates corresponding relations between the identifiers of said plurality of parts and storing destinations in the parts construction file; and a parts shape management table which is provided for each of said client WS and indicates corresponding relations between said plurality of parts shape names and their storing destinations in said parts shape files, wherein said method comprises the steps of:

in said server WS, searching said plurality of parts construction files in response to the identifier which has been transmitted from arbitrary one of said client WSs and which designates the assembly whose shape should be displayed on a display device with reference to said parts construction management table, thereby obtaining the parts shape names corresponding to said plurality of parts constructing the assembly corresponding to said designated assembly corresponding to the identifier;

transmitting said parts shape names derived from said server WS to said client WS;

in said client WS, collecting the shape data of the parts constructing the assembly from said plurality of parts shape files with reference to said parts shape management table; and in said client WS, displaying the assembly onto the display device associated to said client WS.

16. A distributed data managing method in a computer aided design (CAD) system comprising:

a server work station (WS) and a plurality of client WSs which are mutually connected;

a plurality of parts construction files which are respectively connected to said client WS and in which construction information indicative of a hierarchy relation among a plurality of parts constructing an assembly, identifiers corresponding to said parts, parts shape names corresponding to said parts, and storing destinations in said parts shape file corresponding to said parts is distributively stored;

a plurality of parts shape files which are respectively connected to said plurality of client WSs and distributively store shape data of said plurality of parts constructing said assembly;

a parts construction management table which is provided for said server WS and indicates corresponding relations between the identifiers of said plurality of parts and their storing destinations in said plurality of parts construction file; and a parts shape management table which is provided for the server WS and indicates corresponding relations between said plurality of parts shape names and their storing destinations in the parts shape file, wherein said method comprises the steps of:

in said server WS, searching said plurality of parts construction files with reference to said parts construction management table in response to the identifier which has been transmitted from arbitrary one of said client WSs and which designates the assembly whose shape should be displayed on a display device, thereby obtaining the parts shape names corresponding to said plurality of parts constructing said designated assembly of the identifier and said storing destinations;

in said server WS, collecting the shape data of the parts constructing the assembly from said plurality of parts shape files with reference to the parts shape management table;

in said server WS, transmitting the resultant shape data to said client WS; and in said client WS, displaying the assembly onto the display device associated to said client WS.

* * * * *

UNITED STATES PATENT AND TRADEMARK OFFICE
CERTIFICATE OF CORRECTION

PATENT NO. : 5,339,247
DATED : August 16, 1994
INVENTOR(S) : Shigeki Kirihara, et al.

It is certified that error appears in the above-indentified patent and that said Letters Patent is hereby corrected as shown below:

Claim 3, column 9, line 6, delete the second occurrence of "WS" and substitute therefor --WSs--.

Claim 4, column 9, line 48, after "client" insert --WS.--.

Claim 6, column 9, line 52, delete "sided" and substitute therefor --aided--.

Claim 15, column 13, line 19, delete "sided" and substitute therefor --aided--.

Signed and Sealed this

First Day of November, 1994

Attest:

BRUCE LEHMAN

*Attesting Officer*   *Commissioner of Patents and Trademarks*